US 6,587,181 B2

(12) United States Patent
Jinbo et al.

(10) Patent No.: US 6,587,181 B2
(45) Date of Patent: Jul. 1, 2003

(54) OPTICAL SYSTEM WITH IMPROVED DURABILITY FOR PROJECTION EXPOSURE APPARATUS AND METHOD FOR MANUFACTURING OPTICAL SYSTEM FOR PROJECTION EXPOSURE APPARATUS

(75) Inventors: Hiroki Jinbo, Yokohama (JP); Seishi Fujiwara, Sagamihara (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 10/095,106

(22) Filed: Mar. 12, 2002

(65) Prior Publication Data

US 2002/0135746 A1 Sep. 26, 2002

Related U.S. Application Data

(62) Division of application No. 09/437,780, filed on Oct. 25, 1999, now Pat. No. 6,373,554.

(30) Foreign Application Priority Data

Nov. 10, 1998 (JP) .......................................... 10-318472

(51) Int. Cl.$^7$ ........................ G03B 27/54; G03B 27/42; G02B 13/14; C03C 3/04
(52) U.S. Cl. ........................... 355/67; 355/53; 359/350; 501/53
(58) Field of Search ............................. 355/30, 53, 67, 355/74; 359/350, 727; 501/11, 12, 53–54; 356/388; 59/350

(56) References Cited

U.S. PATENT DOCUMENTS

| | | | |
|---|---|---|---|
| 5,086,352 A | 2/1992 | Yamagata et al. | 359/350 |
| 5,696,624 A | 12/1997 | Komine et al. | 359/350 |
| 5,707,908 A | 1/1998 | Komine et al. | 501/153 |
| 5,912,725 A | 6/1999 | Tanitsu | 355/53 |
| 5,969,803 A | 10/1999 | Mercado | 355/67 |
| 6,075,607 A | 6/2000 | Jinbo et al. | 356/388 |
| 6,087,283 A | 7/2000 | Jinbo et al. | 501/54 |
| 6,088,171 A | 7/2000 | Kudo | 359/754 |
| 6,094,941 A | 8/2000 | Fujinoki et al. | 65/30.1 |
| 6,374,639 B2 * | 4/2002 | Komine et al. | 65/17.4 |

FOREIGN PATENT DOCUMENTS

EP        0147029 A1 *   3/1985

* cited by examiner

Primary Examiner—Henry Hung Nguyen
(74) Attorney, Agent, or Firm—Morgan, Lewis & Bockius LLP

(57) ABSTRACT

An optical system is provided in a projection exposure apparatus for processing an excimer laser beam. The optical system includes at least one optical member made of silica glass having a chlorine concentration of about 1 ppm or less, and at least one optical member made of silica glass having a chlorine concentration of about 1 ppm to about 200 ppm.

4 Claims, 5 Drawing Sheets

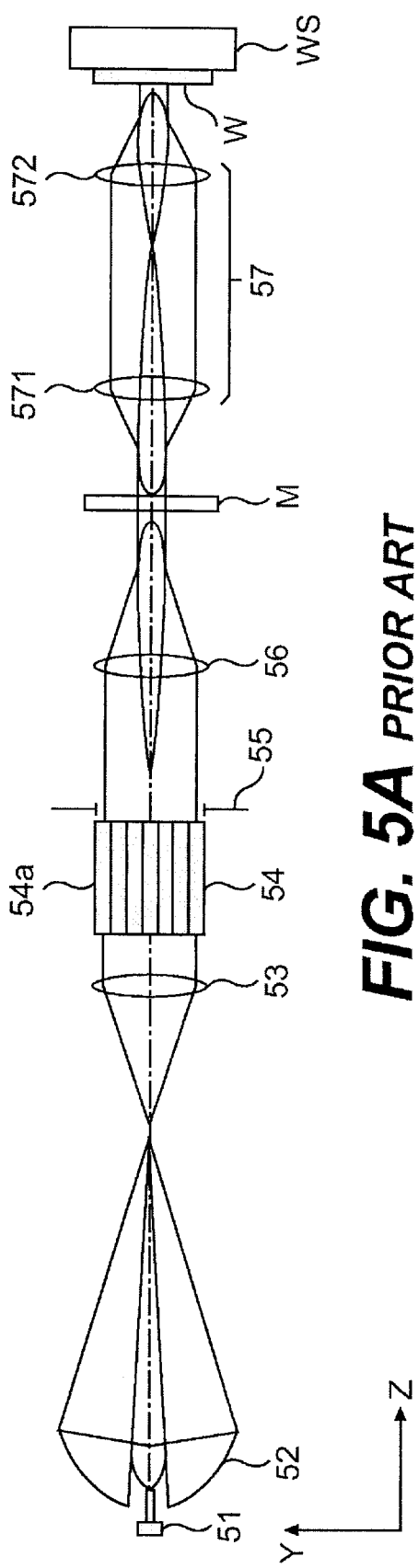
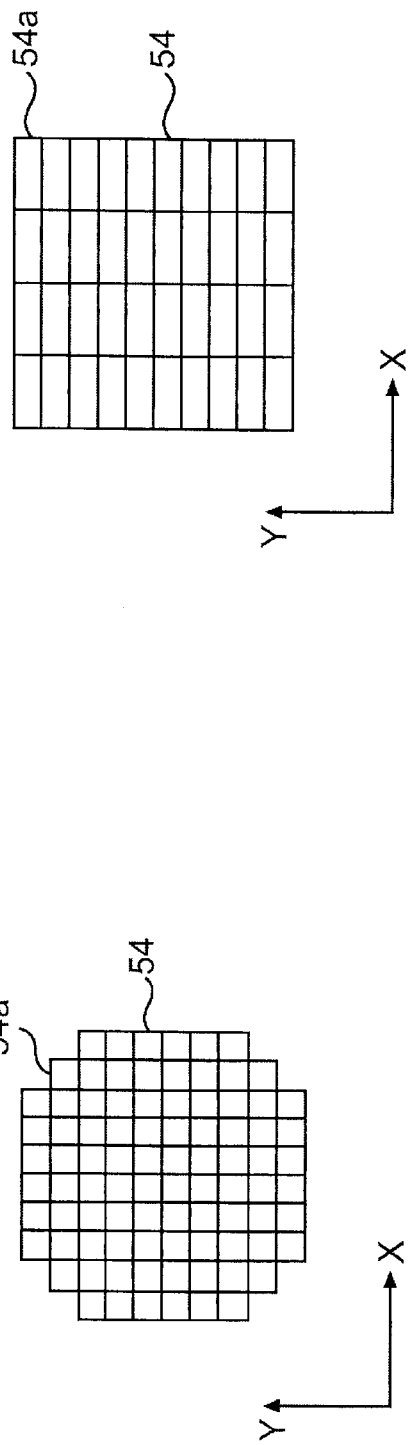
FIG. 5A PRIOR ART
FIG. 5B PRIOR ART
FIG. 5C PRIOR ART

US 6,587,181 B2

OPTICAL SYSTEM WITH IMPROVED DURABILITY FOR PROJECTION EXPOSURE APPARATUS AND METHOD FOR MANUFACTURING OPTICAL SYSTEM FOR PROJECTION EXPOSURE APPARATUS

This is a divisional of U.S. application Ser. No. 09/437,780, filed Oct. 25, 1999, now U.S. Pat. No. 6,373,554, which is incorporated by reference in its entirety. This application claims the benefit of Japanese Application No. 10-318472, filed in Japan on Nov. 10, 1998, which is hereby incorporated by reference.

BACKGROUND OF THE INVENTION

1. Field of the Invention

The present invention relates to an optical system and more particularly, to an optical system of a projection exposure apparatus for transferring a specified mask pattern onto a substrate using a light source in the ultraviolet region for semiconductor manufacture.

Furthermore, the present invention relates to a method for manufacturing an image-focusing optical system which is suitable for use in the illumination optical system or projection optical system of a projection exposure apparatus.

2. Discussion of the Related Art

In the past, an apparatus such as the one shown in FIGS. 5A–5C has been used as a projection exposure apparatus for semiconductor manufacture. As shown in FIG. 5A, a light beam from a light source 51, such as a mercury arc lamp, is focused by an elliptical mirror 52, and is then converted into a parallel light beam by a collimating lens 53. As shown in FIG. 5(B) (or FIG. 5C), this parallel light beam then passes through a fly-eye lens 54 consisting of an aggregate of optical elements 54a with a square cross section, so that a plurality of light source images are formed on the emission side of this lens. An aperture stop 55 having a circular aperture is disposed in this light source image position. The light beams from the plurality of light source images are focused by a condenser lens 56, and are uniformly directed in superimposed form onto a mask M, which constitutes the object of irradiation.

The pattern on the mask M, which has thus been uniformly irradiated by the illumination optical system, is projected and exposed on the surface of a wafer W. Wafer W is coated with a resist by means of a projection optical system 57 consisting of a plurality of lenses 571 and 572. The wafer W is carried on a wafer stage WS, which moves in two dimensions. In the projection exposure apparatus as shown in FIG. 5, exposure is performed using a step-and-repeat scheme in which the wafer stage is successively moved in two dimensions stepwise to expose the next shot area, after the exposure of a given shot area on the surface of the wafer having a plurality of shut areas is completed.

In recent years, a scanning type exposure system has been proposed in which the pattern on the mask M is transferred onto the wafer W at a high throughput by irradiating the mask M with a rectangular or circular-arc-form light beam while synchronously scanning the mask M and the wafer W. Mask M and Wafer W are installed in conjugate positions with respect to the projection optical system.

In both types of projection exposure apparatus, it is desirable that the optical members used in the optical system have a high transmissivity with respect to the wavelength of the light source used. This is because the optical system of a projection exposure apparatus comprises numerous optical members. Even if the light loss per lens is small, the total effect of the drop in transmissivity, which is directly related to the number of optical members used, can be large.

Additionally, in the projection optical system, it is required that the uniformity in the refractive index of the optical members be high in order to obtain a finer and sharper projection exposure pattern. This is because propagation of light in the optical member depends on a local refractive index, and the image-focusing performance of the projection optical system is accordingly greatly affected by the variations in refractive index.

Accordingly, silica glass and calcium fluoride crystal, which have a high transmissivity in the ultraviolet region and possess superior homogeneity, are generally used as the materials for optical members employed in the optical systems of projection exposure apparatus operating in the ultraviolet region (at wavelengths of 400 nm or less).

In recent years, the shortening of light source wavelengths has been proposed as a means of transferring a fine mask pattern image onto the surface of a wafer with an increased resolution. For example, the shortening of wavelengths has progressed from the g-line (436 nm) and i-line (365 nm) used in the past, to KrF (248 nm) and ArF (193 nm) excimer lasers.

Thus, in projection exposure using such short-wavelength excimer lasers, a finer mask pattern image is obtained. However, as the photon energy of the light source itself is increased, so is the energy density of the light with which the optical members are irradiated. As a result of irradiation with light having a high energy density, the optical members are damaged. This damage leads to a drop in transmissivity and a deterioration in other optical characteristics, such as generation of fluorescence or increase in the refractive index.

In addition, to increase the throughput of a projection exposure apparatus, it is desirable to increase the number of substrates that can be processed per hour. It was believed that merely increasing the power of the light source may achieve this. However, increasing the illumination intensity has an adverse affect on the durability of the optical members. Thus, the recent demand towards higher throughput imposes more stringent requirements on the durability of the optical members.

SUMMARY OF THE INVENTION

Accordingly, the present invention is directed to an optical system for a projection exposure apparatus that substantially obviates one or more of the problems due to limitations and disadvantages of the related art.

An object of the present invention is to provide an optical system for use in a projection exposure apparatus that has a superior durability under long-term irradiation with light.

Another object of the present invention is to provide a method for manufacturing such an optical system.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the present invention provides an optical system of a projection exposure apparatus for processing an excimer laser beam, the optical system including at least one optical member made of silica glass having a chlorine concentration of about 1 ppm or less, and at least one optical member made of silica glass having a chlorine concentration of about 1 ppm to about 200 ppm.

In another aspect, the present invention provides an optical system for use in a projection exposure apparatus for processing an excimer laser beam, the optical system including at least one optical member made of silica glass having a chlorine concentration of about 1 ppm or less, at least one optical member made of silica glass having a chlorine concentration of about 1 ppm to about 200 ppm, and at least one optical member made of calcium fluoride crystal.

In another aspect, the present invention provides a method for manufacturing an optical system for a projection exposure apparatus, the method including the steps of installing at least one optical member made of a first silica glass having a chlorine concentration of about 1 ppm or less, and installing at least one optical member made of a second silica glass having a chlorine concentration of about 1 ppm to about 200 ppm, wherein both optical members are installed in accordance with an energy density of light that the corresponding optical member is to process such that a drop in transmissivity caused by irradiation with the light becomes lower than that of an optical system using optical members made of only one of the first and second silica glass.

In another aspect, the present invention provides an optical system for a projection exposure apparatus including at least one optical member made of a first silica glass having a chlorine concentration of about 1 ppm or less, and at least one optical member made of a second silica glass having a chlorine concentration of about 1 ppm to about 200 ppm, wherein both optical members are installed in accordance with an energy density of light that the corresponding optical member is to process such that a drop in transmissivity caused by irradiation with the light becomes lower than that of an optical system using optical members made of only one of the first and second silica glass.

In another aspect, the present invention provides an optical system, including a light source for emitting a pulsed light beam, at least one first optical member for processing the pulsed light beam, the at least one first optical member being disposed at a location within the optical system where the energy density of the pulsed light beam exceeds a predetermined value, the at least one first optical member being made of silica glass having a chlorine concentration of about 1 ppm or less, and at least one second optical member for processing the pulsed light beam, the at least one second optical member being disposed at a location within the optical system where the energy density of the pulsed light beam is less than the predetermined value, the at least one second optical member being made of silica glass having a chlorine concentration of about 1 ppm to about 200 ppm.

In another aspect, the present invention provides an optical system, including a light source for emitting a pulsed light beam, at least one first optical member for processing the pulsed light beam, the at least one first optical member being disposed at a location within the optical system where the energy density of the pulsed light beam exceeds about 1 mJ/cm$^2$/pulse, the at least one first optical member being made of calcium fluoride single crystal at least one second optical member for processing the pulsed light beam, the at least one second optical member being disposed at a location within the optical system where the energy density of the pulsed light beam is less than about 0.5 mJ/cm$^2$/pulse, the at least one second optical member being made of silica glass having a chlorine concentration of about 1 ppm to about 200 ppm.

In a further aspect, the present invention provides an apparatus for projecting an image of a mask pattern on a mask onto a substrate, the apparatus including a light source for emitting a pulsed light beam an illumination optical system directing the pulsed light beam from the light source towards the mask, the illumination optical system including at least one first optical member for processing the pulsed light beam, the at least one first optical member being disposed at a location within the optical system where the energy density of the pulsed light beam exceeds a first predetermined value, the at least one first optical member being made of silica glass having a chlorine concentration of about 1 ppm or less, and at least one second optical member for processing the pulsed light beam, the at least one second optical member being disposed at a location within the optical system where the energy density of the pulsed light beam is less than the first predetermined value, the at least one second optical member being made of silica glass having a chlorine concentration of about 1 ppm to about 200 ppm, furthermore, a projection optical system directing the pulsed light beam that has interacted with the mask towards the substrate to project the image of the mask pattern onto the substrate, the projection optical system including at least one third optical member for processing the pulsed light beam, the at least one third optical member being disposed at a location within the optical system where the energy density of the pulsed light beam exceeds a second predetermined value that is smaller than the first predetermined value, the at least one third optical member being made of silica glass having a chlorine concentration of about 1 ppm or less, and at least one fourth optical member for processing the pulsed light beam, the at least one fourth optical member being disposed at a location within the optical system where the energy density of the pulsed light beam is less than the second predetermined value, the at least one fourth optical member being made of silica glass having a chlorine concentration of about 1 ppm to about 200 ppm.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings:

FIGS. 5A–5C schematically show the construction of a conventional projection exposure apparatus.

DETAILED DESCRIPTION OF THE PREFERRED EMBODIMENTS

Figure 1:
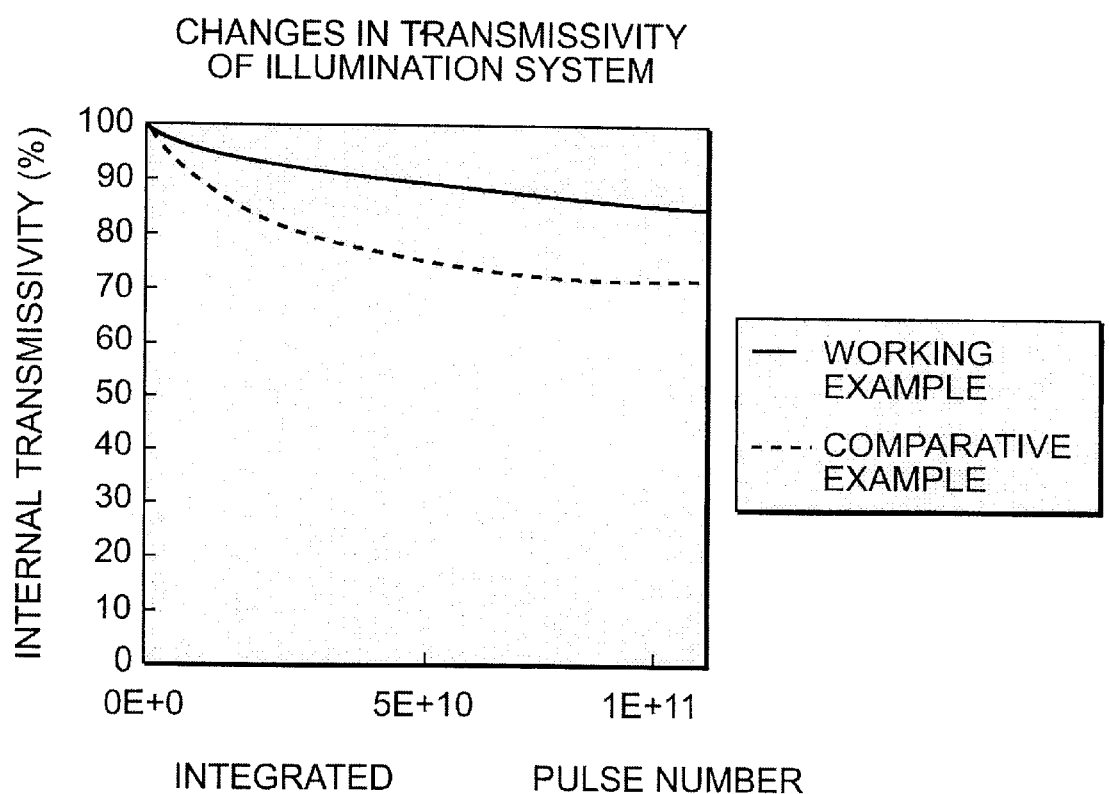
FIG. 1 shows the transmittance changes due to ArF excimer laser irradiation for the optical members of the present invention and a comparative example.

Reference will now be made in detail to the preferred embodiments of the present invention, examples of which are illustrated in the accompanying drawings.

When silica glass is irradiated with ultraviolet light, especially light from a light source which has a high photon energy such as an ArF excimer laser, color centers, such as Si.(E' centers) and Si—O.(NBOHC), are generated via a two-photon absorption process from defect precursors (Si—Si, Si—O—O—Si) and the intrinsic structure of $SiO_2$ (Si—O—Si). This process causes a drop in the transmissivity of the wavelength of the light source. In two-photon absorption processes, it has been proposed to increase the durability of silica glass with respect to ultraviolet irradiation by increasing the hydrogen molecule content in the glass.

It is known that chlorine present in silica glass can act as a color center precursor. As a means of reducing the amount of such chlorine, it has been proposed to synthesize silica glass using an organic silicon compound as a raw material. However, carbon in the raw-material organic silicon compound may remain in the silica glass. Thus, the initial transmissivity prior to irradiation with light tends to be slightly lower than that of silica glass synthesized using silicon tetrachloride as a raw material.

Silicon tetrachloride, which has been used as a raw material for the synthesis of silica glass, causes the resulting silica glass members to have a chlorine content of several ppm to several hundred ppm. As a result, compared to silica glass using an organic silicon compound as a raw material, such silica glass is inferior in terms of resistance to ultraviolet light. Since chlorine contained in the raw material causes metal impurities present in the synthesis atmosphere to be released from the system in the form of chlorides, such a process is advantageous in that extremely high-purity silica glass can be obtained.

As explained above, in the case of silica glass made from silicon tetrachloride as a raw material, the initial transmissivity is good, but the durability tends to be relatively low. In the case of silica glass made from an organic silicon as a raw material, the durability is relatively good, but the initial transmissivity tends to be relatively low.

Furthermore, silica glass has also been proposed in which an effect similar to that of chlorine can be expected as a result of the inclusion of fluorine in the synthesis atmosphere. The inclusion of flourine, which also has a larger bonding energy with silicon than chlorine, also has an effect of increasing the resistance to ultraviolet light. Fluorine-containing silica glass is superior in terms of durability and light transmissivity. However, since the distribution of fluorine in the silica glass is reflected in the distribution of the refractive index, such silica glass is slightly inferior to other types of silica glass, e.g., silica glass using silicon tetrachloride or an organic silicon compound as a raw material, from the standpoint of uniformity of the refractive index. Thus, although fluorine-containing silica glass is superior in terms of the initial transmissivity prior to irradiation with light and in terms of durability against irradiation, the fluorine must be uniformly contained in the glass in order to ensure uniform refractive index distribution.

Thus, the above-mentioned types of silica glass have respective superior advantages, but do not singly satisfy all of the strict requirements in terms of optical characteristics that must be satisfied in optical members used in the optical system of a projection exposure apparatus.

In the image-focusing optical system of a projection exposure apparatus, the energy density of the light beam that irradiates the respective optical members is determined from the area ratio of the light beam from the original light source. In places where the energy density of the light irradiating the optical members is high; i.e., in places where the diameter of the light beam is small, the deterioration of the optical members caused by irradiation with light is more severe than in places where the energy density is low.

Accordingly, in the present invention, a high-durability silica glass is used in optical members installed in places where the energy density of the light from the light source is high, and a silica glass with a high uniformity is used in optical members installed in places where the energy density is low. For example, a silica glass that contains substantially no chlorine that forms defect precursors, preferably a silica glass with a chlorine concentration of about 1 ppm or less, is used in the high-durability optical members installed in places where the energy density is high.

Where the energy density is relatively low; i.e. when the diameter of the light beam illuminating the silica glass is relatively large, a uniform refractive index is required in the silica glass. The reason for this is that the uniformity of the silica glass in places where the diameter of the light beam is large has greater effects on the image-focusing performance of the optical system than the uniformity of the silica glass in places where the diameter of the light beam is small. Accordingly, optical members made of a silica glass that have good initial transmissivity and superior uniformity, i.e., silica glass with a chlorine concentration of about 1 ppm to about 200 ppm, are used in places where the energy density is low.

Method of Manufacturing Silica Glass used in the Present Invention

Examples of methods that can be used to manufacture silica glass of the present invention include:

a) A method in which fine glass particles (so-called "soot") are obtained by hydrolyzing a silicon compound in an oxygen-hydrogen flame. These fine glass particles are accumulated so that a porous glass (so-called "soot body") is formed. Then this porous glass is made transparent at a temperature in the vicinity of the softening point (preferably the melting point) or higher, to obtain a transparent silica glass.

b) A method in which a transparent silica glass is obtained by hydrolyzing a silicon compound in an oxygen-hydrogen flame, and fusing and vitrifying resultant fine glass particles at the same time as the fine glass particles obtained as a result of the hydrolysis are deposited on a target.

Method (a) is known as the soot method, while method (b) is known as the direct method.

In the soot method, there are no particular restrictions on the method used to form the porous glass; a VAD process, OVD process, or sol-gel process, etc., may be used.

Below, respective methods for obtaining a silica glass with a chlorine concentration of about 1 ppm or less and a silica glass with a chlorine concentration of about 1 ppm to about 200 ppm through the direct method (also called the flame hydrolysis method) will be described. Similar synthesis furnaces can be used for both types of silica glass.

Figure 2:
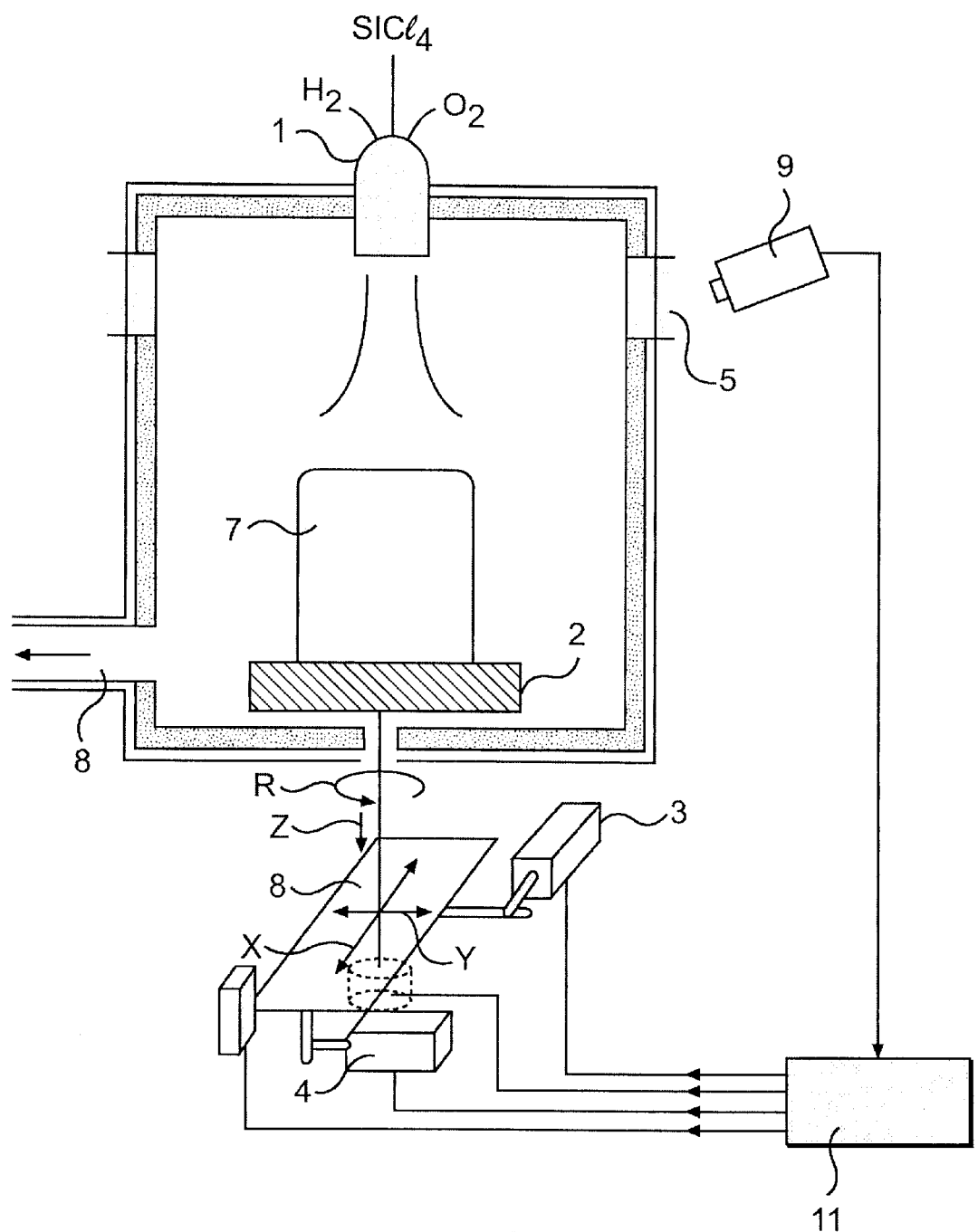
FIG. 2 is a schematic diagram of a synthesis furnace used to synthesize the optical silica glass used in the present invention.

FIG. 2 shows the synthesis furnace used to synthesize the silica glasses used in the present invention.

The burner 1 is a burner with a multi-tube structure made of silica glass, and is installed with its tip end facing a target 2 from the upper portion of the furnace. The furnace walls are constructed of a refractory substance, with one wall having an observation window 5 with an IR camera monitoring system 9 and another wall having an exhaust system 6. A target 2, which is used to form an ingot 7 thereon, is disposed in the lower portion of the furnace. Target 2 is connected via a supporting shaft to an XY stage 8 which is located outside the furnace. The supporting shaft is arranged such that it can be rotated by a motor, and the XY stage 8 is arranged such that it can be moved two-dimensionally in the X direction and Y direction by an X-axis servo motor 3 and Y-axis servo motor 4, respectively. The driving of the X-axis servo motor 3 and Y-axis servo motor 4 is controlled by a controller, such as a computer.

An oxygen-containing gas and a hydrogen-containing gas are emitted from the burner 1, and these gases are mixed to form a flame. A raw-material silicon compound diluted by a carrier gas is emitted into this flame from the central portion of the burner 1, and the raw material is hydrolyzed so that fine silica glass particles are formed. These particles accumulate on the rotating and oscillating target 2, and are simultaneously melted and vitrified to produce a transparent silica glass ingot 7. In this case, the target 2 is lowered in the Z direction so that the upper portion of the ingot is always covered by the flame, and so that the position of the synthesis surface on the upper portion of the ingot is always maintained at a predetermined fixed distance from the burner.

To manufacture silica glass with a chlorine concentration of about 1 ppm or less, a silicon compound, which does not contain chlorine, is used as the raw material and is emitted from the central portion of the burner 1. Examples of such raw materials include, but are not limited to, organic silicon compounds; e.g., siloxanes, such as hexamethyldisiloxane, octamethylcyclotetrasiloxane and tetramethylcyclotetrasiloxane, and silanes such as methyltrimethoxysilane, tetraethoxysilane and tetramethoxysilane; silicon fluorides, such as $SiF_4$ and $Si_2F_6$; and other compounds, such as $SiH_4$ and $Si_2H_6$.

In cases where a silica glass is synthesized using an organic silicon compound as a raw material, metal impurities tend to remain in the silica glass. Accordingly, special attention needs to be paid to avoid contamination of impurities from the synthesis atmosphere. Silica glass thus obtained using organic silicon compounds as raw materials has a chlorine concentration of about 1 ppm or less, and has superior durability against ultraviolet light.

In cases where a silica glass is synthesized using silicon fluoride as a raw material, the silicon fluoride is emitted from a circular tube in the central portion of the burner 1, or from an adjacent ring-form tube. It is desirable that the fluorine content of the silica glass synthesized be in the range of about 0.01 wt % to about 0.5 wt %. If the fluorine content exceeds about 0.5 wt %, the fluorine in the silica glass will be present in the silica glass not only in the form of Si—F, but also in the form of molecular fluorine. As a result, absorption by fluorine molecules will occur in the ultraviolet region, resulting in a low initial transmissivity. A method for manufacturing a fluorine-containing silica glass by the direct method is described in Japanese Patent Application Kokai No. HEI 10-67521, which is hereby incorporated by reference. The resulting silica glass thus obtained using silicon fluoride as a raw material has a chlorine concentration of about 1 ppm or less; this glass has a high initial transmissivity and a superior durability against ultraviolet light. In particular, with respect to durability against ultraviolet light, the silica glass containing fluorine has a high transmissivity, even after the transmissivity drop caused by ultraviolet irradiation reaches saturation. The reason for this is that the silica glass containing fluorine has fewer defect-forming precursors or corresponding structures, as compared to silica glass without flourine.

Next, in order to manufacture silica glass with a chlorine concentration of about 1 ppm to about 200 ppm, a silicon chlorine compound, such as silicon tetrachloride, is used as the raw material, and is emitted from the central portion of the burner 1. In the present invention, silica glass containing chloride is used in optical members installed in places where the energy density of the irradiating light is relatively small. Thus, such optical members must have a large aperture and a highly uniform refractive index. In the manufacture of a silica glass by the direct process using silicon tetrachloride as a raw material, it is desirable that the moving pattern of the target during the synthesis be optimized in order to obtain a silica glass ingot that has a large aperture and a high uniformity. Further, a multi-tube burner with a large cross-sectional area is preferable for producing a large flame. Such a burner may be constructed of, for example, a circular tube in the central portion for emitting a raw material, a plurality of ring-form tubes installed concentrically with the circular tube at the center, and a ring-form tube, at the periphery of the burner, which has a plurality of fine tubes in its interior. Alternatively, the silica glass ingot can also be formed using a plurality of burners.

In order to adjust the chlorine concentration in a silica glass, the raw material supply rate and the growth rate are adjusted. If either of these rates is lowered, the hydrolysis reaction progresses completely so that the chlorine concentration can be lowered.

Thus, the chlorine concentration can be adjusted to a value in the range of about 1 ppm to about 200 ppm by adjusting the raw material supply rate and/or the growth rate. In the case that silicon tetrachloride is used as the raw material in the direct method, a larger amount of chlorine can be included in the silica glass. However, the chlorine concentration more than about 200 ppm has a significantly adverse effect on the durability of the silica glass against ultraviolet light. Accordingly, such a large concentration is undesirable. Also, in using chloride compounds of silicon as raw materials, it is difficult to lower the chlorine concentration to a value below about 1 ppm.

The silica glass thus obtained using a silicon chloride compound as a raw material has a chlorine concentration of about 1 ppm to about 200 ppm. This glass has a superior initial transmissivity, and a highly uniform refractive index.

Next, in the silica glasses used as optical members in the present invention, it is desirable to have a hydrogen molecule content in the range of about $5 \times 10^{17}$ molecules/$cm^3$ to about $5 \times 10^{18}$ molecules/$cm^3$, regardless of the chlorine concentration, in order to improve the durability of the glass against ultraviolet light, especially light from short-wavelength ultraviolet lasers. If this content is less than about $5 \times 10^{17}$ molecules/$cm^3$, the durability against ultraviolet light required in a projection exposure apparatus is not satisfied. On the other hand, if this content exceeds about $5 \times 10^{18}$ molecules/$cm^3$, the absorption in the initial stage of irradiation tends to be increased. Accordingly, a content of approximately $5 \times 10^{18}$ molecules/$cm^3$ is sufficient for stable exposure. However, there are cases where some members in the illumination optical system suffer from fluctuations in transmissivity caused by on-off switching of the light irradiation from the light source (referred to as "dose error"). In that case, it is desirable to use a silica glass in which the hydrogen molecule content is about $1 \times 10^{12}$ molecules/$cm^3$ to about $1 \times 10^{17}$ molecules/$cm^3$ to reduce such fluctuations.

The hydrogen molecule content can be adjusted by varying the ratio in amount of the oxygen-containing gas to hydrogen-containing gas emitted from the burner, or by controlling the temperature of the synthesis surface of the ingot. Also, hydrogen can be included in the glass by heat-treating the synthesized silica glass ingot in a hydrogen atmosphere. In such a case, however, care must be taken to avoid contamination of impurities during the heat treatment in order to ensure that the initial transmissivity of the silica glass is not lowered. Conversely, if desired, the amount of hydrogen in the glass can be lowered by heat-treating the synthesized silica glass ingot in a non-hydrogen atmosphere.

The durability of the silica glass synthesized as described above against ultraviolet light can be predicted as described in detail in U.S. application Ser. No. 09/166,528, which is hereby incorporated by reference (Japanese Patent Application Kokai No. HEI 9-274200).

Thus, an image-focusing optical system can be designed by predicting the durability of respective silica glasses, and effectively combining these glasses.

Figure 3A:
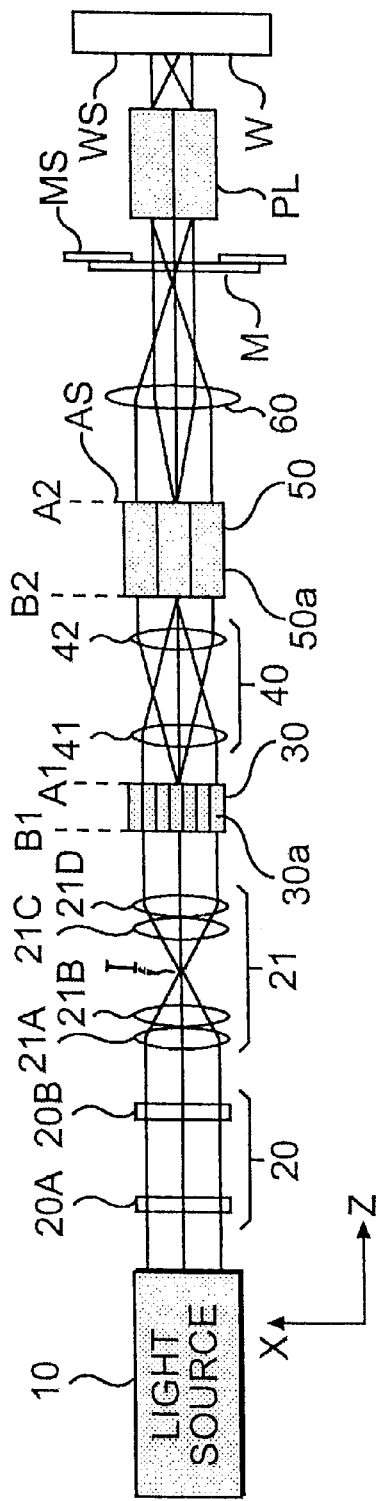
FIGS. 3A and 3B schematically show the construction of a projection exposure apparatus according to a preferred embodiment of the present invention.
Figure 3B:
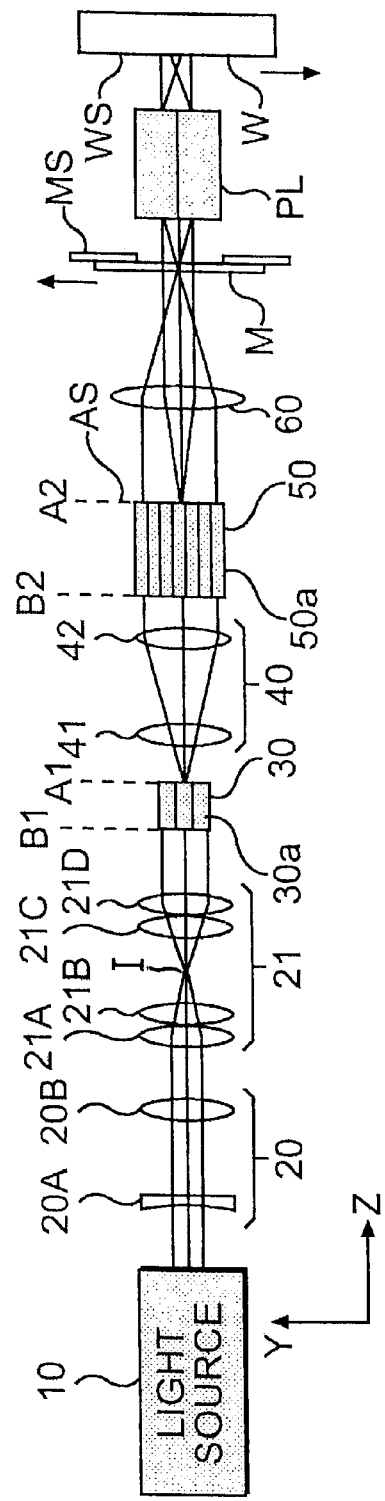

FIGS. 3A and 3B show a preferred embodiment of the projection exposure apparatus of the present invention. FIG. 3A is a diagram showing the apparatus as viewed from directly above. FIG. 3B is a diagram showing the construction as viewed from the side. As shown in FIGS. 3A and 3B, an essentially parallel light beam, which has a wavelength of 248 nm (ArF excimer laser), 193 nm (KrF excimer laser) or 157 nm ($F_2$ laser), is output from a light source 10. Thus, light source 10 supplies light of a specified wavelength, such as an excimer laser. The cross-sectional shape of the parallel light beam in this case is rectangular. The parallel light beam from the light source 10 enters a beam-shaping optical system 20 that is used as a beam-shaping part that shapes the beam into a light beam with a specified cross-sectional shape. This beam-shaping optical system 20 is constructed from two cylindrical lenses 20A and 20B, which have a refractive power in the direction perpendicular to the plane of FIG. 3A (i.e., in the direction parallel to the plane of FIG. 3B). The cylindrical lens 20A on the light source side has a negative refractive power, and causes the light beam in the direction of the plane of FIG. 3B to diverge. On the other hand, the cylindrical lens 20B on the object side has a positive refractive power, and focuses the diverging light beam from the cylindrical lens 20A into a parallel light beam. Accordingly, the parallel light beam from the light source 10 that has passed through the beam-shaping optical system 20 is shaped into a rectangular shape which has an expanded beam width in the direction of the plane of FIG. 3B, with a specified cross-section. A combination of cylindrical lenses with a positive refractive power may instead be used as the beam-shaping optical system 20. Alternately, or additionally, an anamorphic prism may be used in the beam-shaping optical system 20.

The shaped beam from the beam-shaping optical system 20 enters a first relay optical system 21. The first relay optical system 21 has a front group with a positive refractive power consisting of two positive lenses 21A and 21B, and a rear group with a positive refractive power consisting of two positive lenses 21C and 21D. The front group 21A and 21B of the first relay optical system forms the focal point I at a focal position on the mask M side of this front group. The rear group 21C and 21D of the first relay optical system is positioned such that the focal position on the light source side coincides with the focal position of the front group 21A and 21B. Furthermore, this first relay optical system 21 is adapted to make the emission surface of the light source 10 conjugate with the entry surface of an optical integrator 30, which is used as a first multi-light-source image forming system. Due to this function of the first relay optical system 21, the deviation of the light beam illuminating the optical integrator 30, which may be caused by the angular deviation of the light from the light source 10 can be corrected, so that the tolerance in the angular deviation of the light from the light source 10 is increased. Here, the light-guiding optical system for guiding the light from the light source 10 to the first multi-light-source image forming system (optical integrator 30) is constituted of the beam-shaping optical system 20 and the first relay optical system 21.

The light beam that has passed through the first relay optical system 21 enters the optical integrator 30 which is used as a first multi-light-source image forming system for forming a plurality of light source images arranged linearly in three rows. This optical integrator 30 is constructed by installing a plurality of lens elements, each of which is convex on both sides, and has a substantially square lens cross section, so that the optical integrator 30 has a rectangular cross section as a whole. Furthermore, the respective lens elements are convex on both sides and have equal curvatures (refractive powers) in the plane of FIG. 3A and in the plane of FIG. 3B.

As a result, the parallel light beams passing through the individual lens elements constituting the optical integrator 30 are respectively focused so that multiple light source images are formed on the emission sides of the respective lens elements. Accordingly, a plurality of light source images corresponding to the number of lens elements are formed at the emission-side position $A_1$ of the optical integrator 30. Thus, in effect, a secondary light source is formed there.

The light beams from the plurality of two-dimensionally arranged light sources of the optical integrator 30 are focused by a second relay optical system 40, and enter an optical integrator 50 used as a second multi-light-source image forming system which forms a plurality of light source images.

This optical integrator 50 is constructed by installing a plurality of lens elements, each of which is convex on both sides and has a rectangular lens cross section. Each of the lens elements has a cross-sectional shape similar to the entire cross-sectional shape of the optical integrator 30. The optical integrator 50 has a square cross section as a whole. Moreover, the respective lens elements have equal curvatures (refractive power) in the plane of FIG. 3A, and in the plane of FIG. 3B. Here, optical integrators 30, 50 are illustrated in the form of a fly-eye lens. However they are not limited to the fly-eye lens. For example, it is possible to use a micro-fly-eye constructed of a plurality of minute lens elements, rod-shape optical elements of internal reflective type (Kaleidoscope rod), or a diffraction optical element (DOE).

The light beams from the optical integrator 30, which pass through the individual lens elements of the optical integrator 50, are respectively focused so that multiple light source images are formed on the emission sides of the respective lens elements. Consequently, a plurality of light source images arranged in a square shape are formed at the position $A_2$ on the emission side of the optical integrator 50. Thus, in effect, a tertiary light source is formed there.

Furthermore, the second relay optical system 40 is adapted to make the entry surface position $B_1$ of the optical integrator 30 conjugate with the entry surface position $B_2$ of the optical integrator 50, and to make the emission surface position $A_1$ of the optical integrator 30 conjugate with the emission surface position $A_2$ of the optical integrator 50.

An aperture stop AS, which has an aperture of a specified shape, is disposed in the position $A_2$ where the above-mentioned tertiary light source is formed, or in a position located in the vicinity of the position $A_2$. The light beam from the tertiary light source, which is formed into a circular shape by this aperture stop AS, is focused by a condenser optical system 60 used as a focusing optical system, and uniformly illuminates the surface of mask M (constituting the object of irradiation) in slit form.

The mask M is held on a mask stage MS, and a photosensitive substrate, such as a wafer W, is held on a wafer stage WS. The mask M on the mask stage MS and the wafer W on the wafer stage WS are positioned at conjugate positions with respect to the projection optical system PL, and the circuit pattern portion of the mask M illuminated in slit form is projected onto the wafer by the projection optical system PL.

In actual projection exposure using the projection exposure apparatus constructed as described above, the mask stage MS and wafer stage WS are moved in opposite directions as indicated by the arrows in FIG. 3B, and the pattern on the reticle is successively transferred onto the wafer.

Next, the lens arrangement of the illumination optical system will be described. In the illumination optical system shown in FIG. 3A, the energy density is relatively high when the light beam from the light source 10 is guided through the first relay optical system 21. The reason for this is that since the energy density is inversely proportional to the cross-sectional area of the light beam, the energy density is high in optical members on which light with a small beam diameter is incident. Since the first relay optical system 21 forms the focal point I of the total light beam from the light source 10 in the light path between the front group 21A and 21B and rear group 21C and 21D, the flux cross-section of the light beam at the positive lens 21B of the front group and the positive lens 21C of the rear group in the first relay optical system is small, so that the energy density is high.

Accordingly, in the illumination optical system of the present invention, such as shown in FIG. 3A, optical members made of a silica glass with a chlorine concentration of about 1 ppm or less are used as optical members at places where the energy density is "high", and optical members made of a silica glass with a chlorine concentration of about 1 ppm to about 200 ppm are used as the remaining optical members. As a result, the durability against ultraviolet light s greatly improved as compared to the cases where the optical system is constructed using only silica glass with a chlorine concentration of several tens of ppm. The term, "the energy density is high," refers to the energy density exceeding about 0.5 mJ/cm$^2$/pulse, and the term "the energy density is low" refers to the energy density less than about 0.5 mJ/cm$^2$/pulse, in the case of illumination optical systems. Preferably, calcium fluoride single crystal, which has a higher durability than silica glass, is used at places processing light having higher energy density of about 1 mJ/cm$^2$/pulse or greater (or about 5 mJ/cm$^2$/pulse or greater).

Next, the projection optical system PL shown in FIGS. 3A and 3B is explained in more detail. For example, the projection optical system has a construction shown in FIG. 4.

Listed in order from the side of the reticle R constituting the first object, this projection optical system has a first lens group G1 with a positive power, a second lens group G2 with a positive power, a third lens group G3 with a negative power, a fourth lens group G4 with a positive power, a fifth lens group G5 with a negative power, and a sixth lens group G6 with a positive power. This projection optical system is substantially telocentric on the object side (the reticle R side) and image side (the wafer W side), and has a reducing ratio. Furthermore, the numerical aperture (N.A.), of this projection optical system is 0.6, and the projection reduction ratio is 1/4.

In this projection optical system, optical members made of a silica glass with a chlorine concentration of about 1 ppm or less are used at places where (for example) the energy density exceeds about 0.05 mJ/cm$^2$/pulse, and optical members made of a silica glass with a chlorine concentration of about 1 ppm to about 200 ppm are used at places where the energy density is less than about 0.05 mJ/cm$^2$/pulse.

Generally, the aperture of a lens is smaller with a higher irradiating energy density, and the aperture is larger with a lower irradiating energy density. In a projection optical system, the requirements regarding uniformity of the refractive index are stricter. Silica glass manufactured using SiCl$_4$ as a raw material has a highly uniform refractive index and therefore is suitable for large aperture lenses. Accordingly, it is desirable to use such a silica glass in optical members processing a relatively low energy density.

Figure 4:
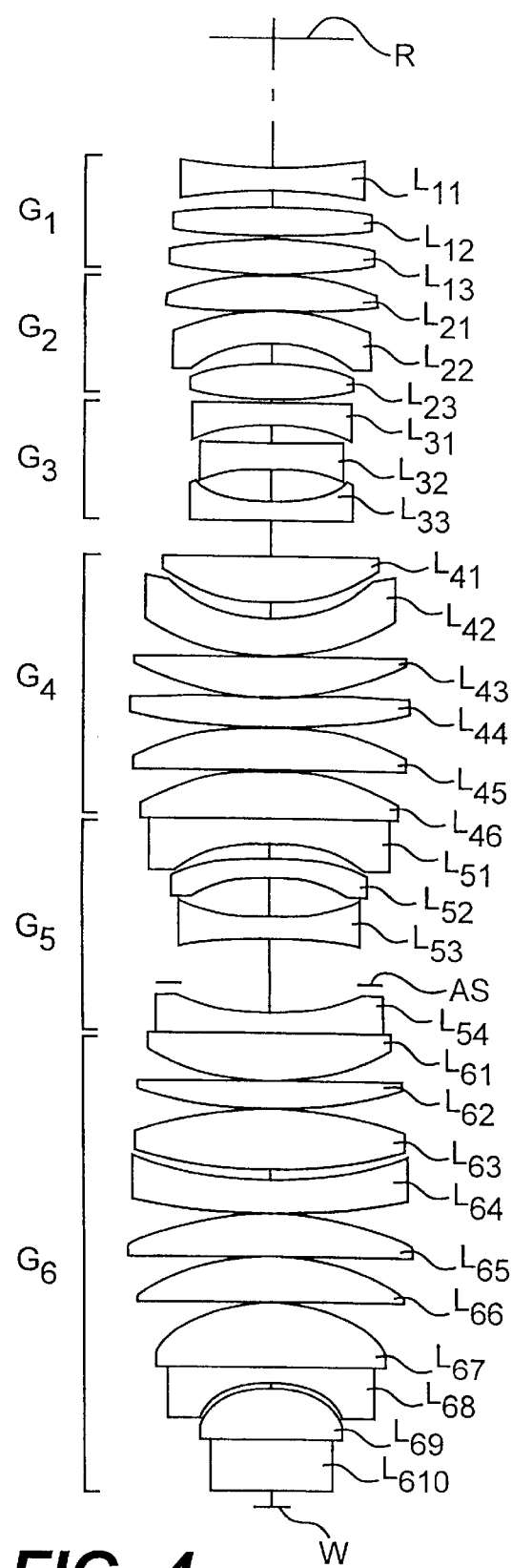
FIG. 4 schematically shows the construction of a projection optical system of a projection exposure apparatus according to a preferred embodiment of the present invention.

Furthermore, in the projection optical system shown in FIG. 4, calcium fluoride single crystals are used in six lenses, i.e., L45, L46, L63, L65, L66 and L67, for the purpose of correcting chromatic aberration.

Reference will now be made in detail to the working examples of the present invention.

Manufacture of Synthetic Silica Glass I

A synthetic silica glass ingot with a diameter of 450 mm and a thickness of 1000 mm was obtained by the oxygen-hydrogen flame hydrolysis process using SiCl$_4$ as a raw material, with the oxygen/hydrogen gas ratio of the combustion gas set at 0.3 to 0.5. Various samples with a diameter of 350 mm and a thickness of 200 mm were cut from this ingot. These samples were maintained at 1000° C. for 10 to 100 hours. After being gradually cooled to 500° C. at the rate of 1 to 10° C./hr, the sample members were cooled to room temperature.

These sample members satisfied the specifications for initial transmissivity and uniformity in the refractive index. These samples had a hydrogen molecule concentration of $5\times10^{17}$ molecules/cm$^3$ or greater, and a Cl content of 70 ppm.

An evaluation sample with a diameter of 60 mm and a thickness of 10 mm was cut from the sample and was subjected to high-precision polishing and high-grade cleaning. The evaluation sample was then irradiated with an ArF excimer laser and the absorption behavior was investigated. It was found that the required specification was satisfied for use in an illumination optical system except for places where the density of the irradiating energy is high (greater than 0.5 mJ/cm$^2$/pulse).

Similarly, it was found that the absorption was estimated to be 0.1%/cm or less even after use for a period of ten years, in a projection optical system except for places where the energy density is particularly high.

Manufacture of Synthetic Silica Glass II

A synthetic silica glass ingot with a diameter of 400 mm and a thickness of 1000 mm was obtained by the oxygen-hydrogen flame hydrolysis process using HMDS (hexamethyldisiloxane) as a raw material, with the oxygen/hydrogen gas ratio of the combustion gas set at 0.3 to 0.6. Various samples with a diameter of 320 mm and a thickness of 200 mm were cut from this ingot. These samples were maintained at 1000° C. for 10 to 100 hours. After being gradually cooled to 500° C. at the rate of 1 to 10° C./hr, the samples were cooled to room temperature.

These samples satisfied the specifications for initial transmissivity and uniformity in the refractive index, and had a hydrogen molecule concentration of $5\times10^{17}$ molecules/cm$^3$ or greater. Since there was no Cl in the raw material, the Cl concentration was below the detection limit (1 ppm).

An evaluation sample with a diameter of 60 mm and a thickness of 10 mm was cut from the sample and was subjected to high-precision polishing and high-grade cleaning. The evaluation sample was then irradiated with an ArF excimer laser and the absorption behavior was investigated. In portions of the illumination system it was found that the required specifications were satisfied for use in an illumination optical system even where the irradiating energy density was especially high, as long as this energy density was about 5 mJ/cm$^2$/pulse or less.

Illumination Optical System

Next, a working example of an illumination optical system according to the present invention is described. A calcium fluoride single crystal, which has a superior durability against ArF excimer laser light, was used at places where the irradiating energy density was especially high; i.e., where the energy exceeds about 5 mJ/cm$^2$/pulse. A silica glass, with a Cl concentration of about 1 ppm or less manufactured using the above-mentioned organic silicon compound as a raw material, was used in places where the energy density exceeded about 0.5 mJ/cm$^2$/pulse, and a silica glass manufactured using the above-mentioned SiCl$_4$ as a raw material was used at places where the irradiating energy density was "low" (less than about 5 mJ/cm$^2$/pulse).

Measured changes in the transmissivity of the illumination optical system of this working example are shown in FIG. 1. A comparative example in FIG. 1 also shows changes in the transmissivity for an illumination optical system in which silica glass manufactured using SiCl$_4$ as a raw material was used for all optical elements that process the energy density lower than about 5 mJ/cm$^2$/pulse.

Furthermore, when the durability (namely changes in transmissivity over time) with respect to excimer laser irradiation was estimated, it was found that the drop in transmissivity from the initial transmissivity occurring over a period of 10 years of use was 15% or less.

Accordingly, the present working example of the illumination optical system was found to have a superior durability.

Projection Optical System

Optical members made of a silica glass with a chlorine concentration of about 1 ppm or less manufactured using the above-mentioned organic silicon compound as a raw material were used at places where the energy density exceeded about 0.05 mJ/cm$^2$/pulse, and optical members made of a silica glass with a chlorine concentration of about 1 ppm to about 200 ppm manufactured using SiCl$_4$ as a raw material, as mentioned above, were used at places where the energy density was less than about 0.05 mJ/cm$^2$/pulse. Furthermore, six calcium fluoride single crystal optical members were used for the purpose of correcting chromatic aberration.

The absorption due to long-term use of this projection optical system over a period of 10 years was estimated based on measurements. It was found that the absorption value was about 0.1%/cm or less.

Thus, in the present invention, by selecting suitable materials respectively in individual optical members in accordance with the corresponding irradiating energy density, it is possible to maintain the initial performance with little drop in the quantity of transmitting light due to the deterioration of the illumination system or deterioration in image-focusing performance of the projection lenses due to absorption.

It will be apparent to those skilled in the art that various modifications and variations can be made in an optical system having superior durability against ultraviolet light and method for manufacturing the same of the present invention without departing from the spirit or scope of the invention. Thus, it is intended that the present invention cover the modifications and variations of this invention provided they come within the scope of the appended claims and their equivalents.

What is claimed is:

1. An optical system for use in a projection exposure apparatus for processing an excimer laser beam, the optical system comprising:
   at least one optical member made of silica glass having a chlorine concentration of about 1 ppm or less; and
   at least one optical member made of silica glass having a fluorine content of about 0.01 wt % to about 0.5 wt %,
   wherein, both optical members are located in accordance with an energy density of light that each said optical member is to process.

2. An optical system for use in a projection exposure apparatus for processing an excimer laser beam, the optical system comprising:
   at least one optical member made of silica glass having a chlorine concentration of about 1 ppm to about 200 ppm; and,
   at least one optical member made of silica glass having a fluorine content of about 0.01 wt % to about 0.5 wt %,
   wherein both optical members are located in accordance with an energy density of light that each said optical member is to process.

3. An optical system for use in a projection exposure apparatus for processing an excimer laser beam, the optical system comprising:
   at least one optical member made of silica glass having a chlorine concentration of about 1 ppm or less; and,
   at least one optical member made of silica glass having a chlorine concentration of about 1 ppm to about 200 ppm; and,
   at least one optical member made of silica glass having a fluorine content of about 0.01 wt % to about 0.5 wt % each, wherein each optical member is located in accordance with an energy density of light that each said optical member is to process.

4. The optical system according to any one of claims 1 through 3, wherein said silica glass having the fluorine content of about 0.01 wt % to about 0.5 wt % has a chlorine concentration of about 1 ppm or less.

* * * * *